United States Patent
Chen et al.

[11] Patent Number: 6,093,618
[45] Date of Patent: Jul. 25, 2000

[54] METHOD OF FABRICATING A SHALLOW TRENCH ISOLATION STRUCTURE

[75] Inventors: Chih-Rong Chen, Taitung; Yunn-Ming Tsou; Yong-Fen Hsieh, both of Hsinchu Hsien, all of Taiwan

[73] Assignee: United Microelectronics Corp., Hsinchu, Taiwan

[21] Appl. No.: 09/098,251

[22] Filed: Jun. 16, 1998

[30] Foreign Application Priority Data

Mar. 17, 1998 [TW] Taiwan ................................. 87103891

[51] Int. Cl.[7] ..................................................... H01L 21/76
[52] U.S. Cl. ........................ 438/400; 438/400; 438/296; 438/401; 438/424; 438/435; 438/437
[58] Field of Search .................... 438/400, 424, 438/437, 435, 296, 401

[56] References Cited

U.S. PATENT DOCUMENTS

| | | | |
|---|---|---|---|
| 5,950,093 | 9/1999 | Wei | 438/401 |
| 5,963,819 | 10/1999 | Lan | 438/424 |
| 5,970,363 | 10/1999 | Kepler et al. | 438/435 |
| 5,981,353 | 11/1999 | Tsai | 438/424 |

*Primary Examiner*—David Nelms
*Assistant Examiner*—Phuc T. Dang

[57] ABSTRACT

A method of fabricating a shallow trench isolation structure includes defining a shallow trench isolation region on a substrate covered by a first oxide layer and a mask layer. Then, covering the inner surface of the shallow trench with a silicon nitride layer. After a thermal treatment, two oxide layers are formed at the two sides of the silicon nitride layer, respectively. Then, another oxide layer is formed to fill the shallow trench. Next, a planarization process is performed until the mask layer is exposed. The mask layer and the first oxide layer and the oxide layer higher than the substrate are removed.

24 Claims, 4 Drawing Sheets

METHOD OF FABRICATING A SHALLOW TRENCH ISOLATION STRUCTURE

CROSS-REFERENCE TO RELATED APPLICATION

This application claims the priority benefit of Taiwan application serial no. 87103891, filed Mar. 17, 1998, the full disclosure of which is incorporated herein by reference.

BACKGROUND OF THE INVENTION

1. Field of the Invention

This invention relates to a method of fabricating an isolation structure of integrated circuit (IC), and more particularly, to a method of fabricating a shallow trench isolation (STI) structure to avoid dislocation.

2. Description of Related Art

An intact IC is formed of thousands or millions of metal oxide semiconductor (MOS) transistors. For example, a dynamic random access memory (DRAM) or a static random access memory (SRAM) is one of this intensive type of semiconductor circuit. As the integration of the devices becomes higher and higher, the isolation between the devices becomes more important than before. To prevent short circuit occurring at adjacent transistors, a dielectric layer used for isolation is usually added for enhancing the insulation effect. The dielectric layer is so called field oxide (FOX). The conventional local oxidation technique (LOCOS) has the disadvantages of stress, the formation of bird's beak so that it is now less used. More recently, the field oxide layer now is mostly formed by shallow trench isolation technique.

Typically, the STI is formed by the following steps. After the formation of the shallow trenches, a liner oxide layer is formed on the inner surface of the shallow trench. The material of the liner oxide layer is usually silicon dioxide. The trenches are then fully filled with silicon dioxide. The silicon dioxide in the trenches is then densified at high temperature. However, during the process of densification, as the stress is higher than the critical point, dislocation may occur to reduce the strain energy caused by the stress, which is undesired.

The formation of the STI structure is strongly effected by the layout. The silicon dioxide grows along the orientation of (111) at the trench corner. Therefore, at the trench corner, the growth rate of the silicon dioxide is slower than at the trench sidewall. Consequently, the silicon dioxide layer at the trench corner is thinner. Moreover, silicon oxide produces compress stress on the substrate so that the phenomenon of dislocation may occur below the active region and the are a adjacent the STI and also below the STI region. Especially, for the product like SRAM, dislocation tends to occur along the low energy orientation (111). Dislocation is one of the main reasons of leakage current.

FIG. 1A to FIG. 1D are cross sectional views showing a conventional process of forming a shallow trench isolation structure.

Referring to FIG. 1A, on a substrate 100, a pad oxide layer is formed by thermal oxidation. A silicon nitride layer is then deposited by chemical vapor deposition (CVD). Then, after a photoresist layer 106 is primed, the wafer is processed through photolithography to define the STI region. An anisotropic dry etching, using plasma, is the used to form a pad oxide layer 102 and a silicon nitride layer 104. As the anisotropic dry etching process continues, a shallow trench 107 down to the substrate 100 can be formed.

Referring to FIG. 1B, after removing the remained photoresist layer 106, a thermal oxidation process is performed to form a liner oxide layer 112 on the exposed surface of the shallow trench 107. However, at the top corner 111 and the bottom corner 113, the silicon oxide layer grows slower and therefore the thickness is thinner. On the other hand, at the middle part of the periphery of the shallow trench 107, silicon oxide grows faster and therefore the thickness at this region is thicker. Consequently, the liner oxide layer 112 is thicker at the middle part of the periphery but thinner at the top corner and the bottom corner.

Referring to FIG. 1C, silicon oxide 122 is deposited into the shallow trench 107 so that the level of the silicon oxide layer 122 is higher than the silicon nitride layer 104 by using atmospheric pressure chemical vapor deposition (APCVD). Next, the silicon oxide layer 122 is densified. Usually, the process of densification is performed at about 1000° C. Due to the inconsistent thickness of the liner oxide layer 112, the compressive stress of the silicon oxide layer onto the substrate 100 would not be equal at different points so that dislocation occurs at the top corner and the bottom corner below the active region and below the STI region.

Referring to FIG. 1D, in the existence of slurry, a chemical mechanical polishing (CMP) is performed on the oxide layer 122 on the Wafer surface under a well-controlled pressure. The surface of the oxide layer 122 is polished until the surface of the silicon nitride layer 104 is exposed. Then, hot phosphoric acid is used to remove the silicon nitride layer 104 and hydrofluoric acid is used to remove the pad oxide layer 102 and the remained oxide layer 122 higher than the surface of the substrate 100 so that the oxide layer 122a is left in the shallow trench. By now, the STI isolation structure is completed; however, the phenomenon of dislocation occurs at the substrate 100.

SUMMARY OF THE INVENTION

It is therefore an objective of the present invention to provide a method of fabricating a STI structure to prevent dislocation.

It is another an objective of the present invention to provide a method of fabricating a STI structure without leakage current.

A method of fabricating a shallow trench isolation structure is therefore disclosed, which includes defining a shallow trench isolation region on a substrate covered by a first oxide layer and a mask layer. Then, covering the inner surface of the shallow trench with a silicon nitride layer. After a thermal treatment, two oxide layers are formed at the two sides of the silicon nitride layer, respectively. Then, another oxide layer is formed to fill the shallow trench. Next, a planarization process is performed until the mask layer is exposed. The mask layer and the first oxide layer and the oxide layer higher than the substrate are removed.

In conclusion, according to the invention, a silicon nitride layer is deposited on the periphery of the shallow trench. The extensive stress produced by the silicon nitride layer offsets the compress stress produced by the liner oxide layer. Therefore, the phenomenon of dislocation occurs bellow the active region and the shallow trench can be prevented.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

FIG. 2A to 2E are cross sectional views showing the process flow of forming a shallow trench isolation structure according to a preferred embodiment of the invention.

Figure 1A:
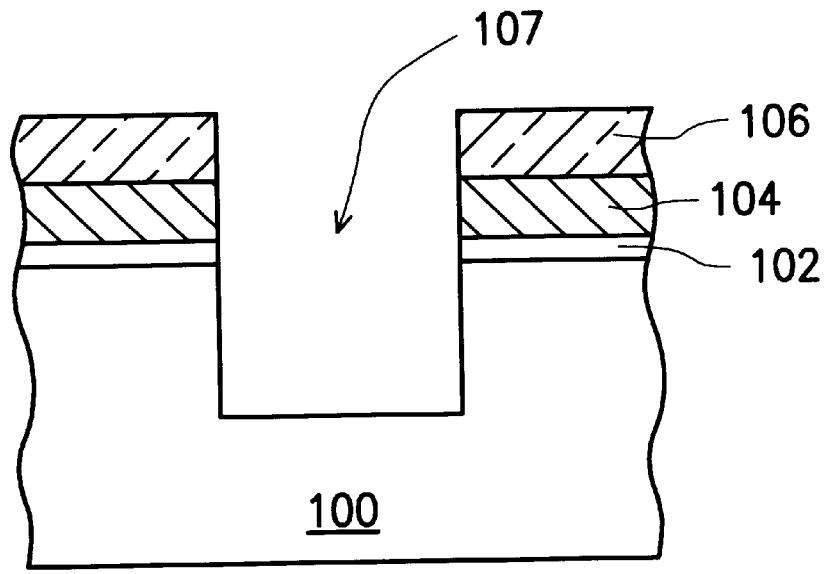
FIG. 1A to 1D are cross sectional views showing the process flow of forming a conventional shallow trench isolation structure.
Figure 1B:
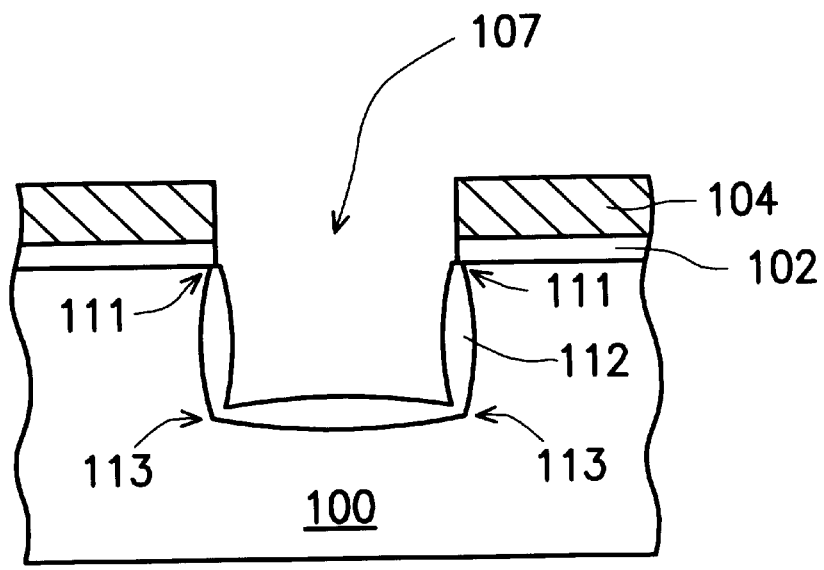
Figure 1C:
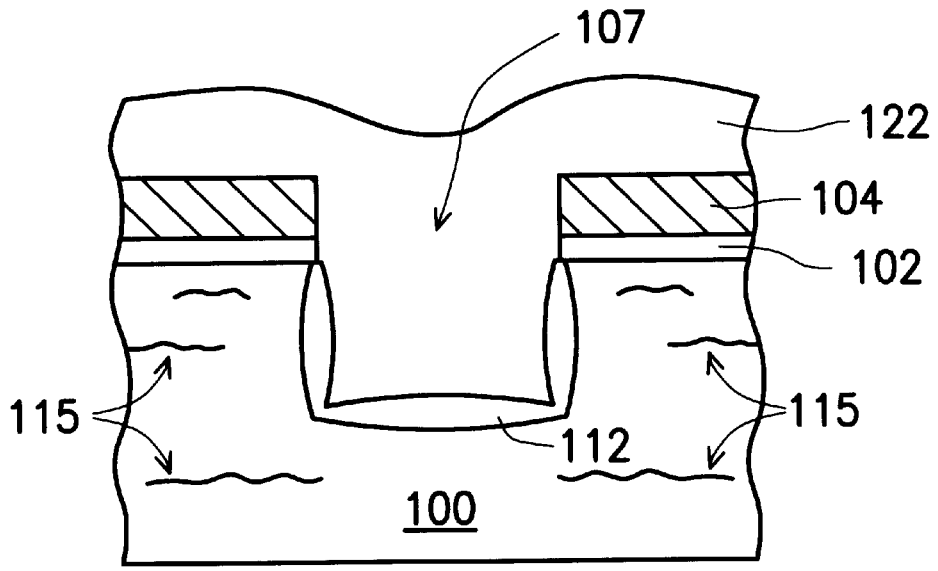
Figure 1D:
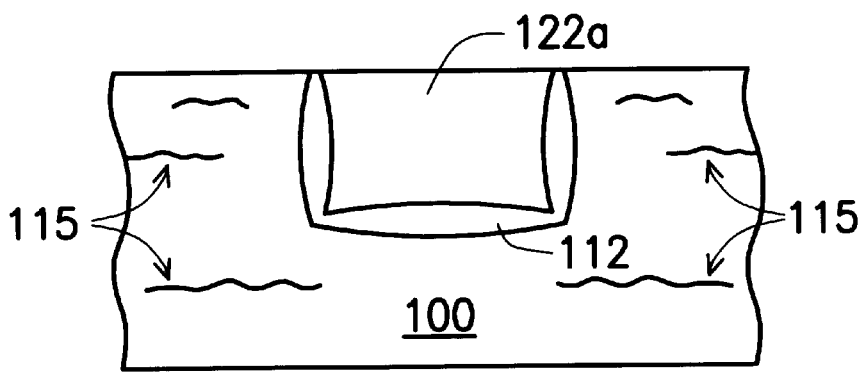
Figure 2A:
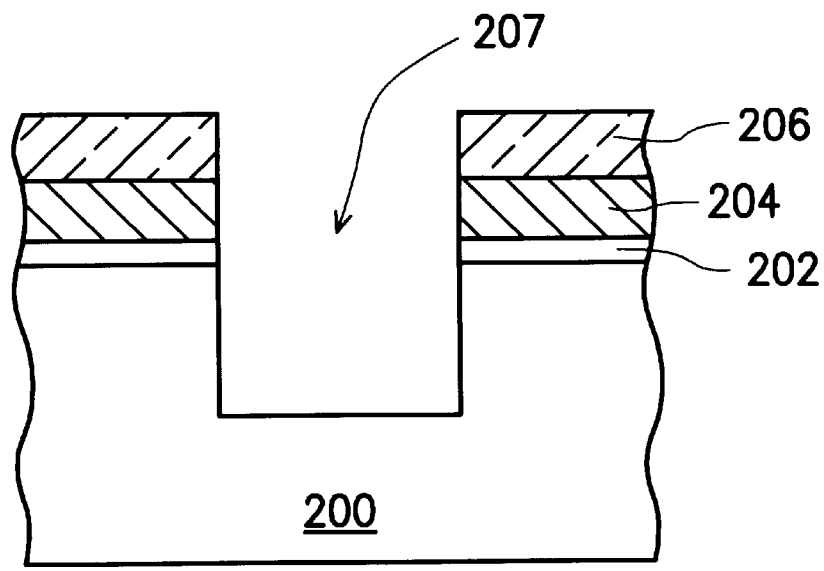
FIG. 2A to 2E are cross sectional views showing the process flow of forming a shallow trench isolation structure according to a preferred embodiment of the invention.

Referring to FIG. 2A, on a substrate 200, a pad oxide layer is formed to have a thickness of about 50 to 500 Å, preferably by thermal oxidation. A silicon nitride layer is then deposited. The silicon nitride layer is used as a mask layer during the continuous etching process of forming shallow trenches. The silicon nitride layer can be formed by CVD to have a thickness of about 1000 to 2000 Å. Next, a photoresist layer is primed and the wafer is processed through photolithography technique to define the STI region. The steps of defining the STI region include: forming a patterned photoresist layer 206 on the wafer, performing an anisotropic etching process to form a pad oxide layer 202 and a silicon oxide layer 204. As the etching process continues, a shallow trench 207 is formed down to the substrate 200.

Figure 2B:
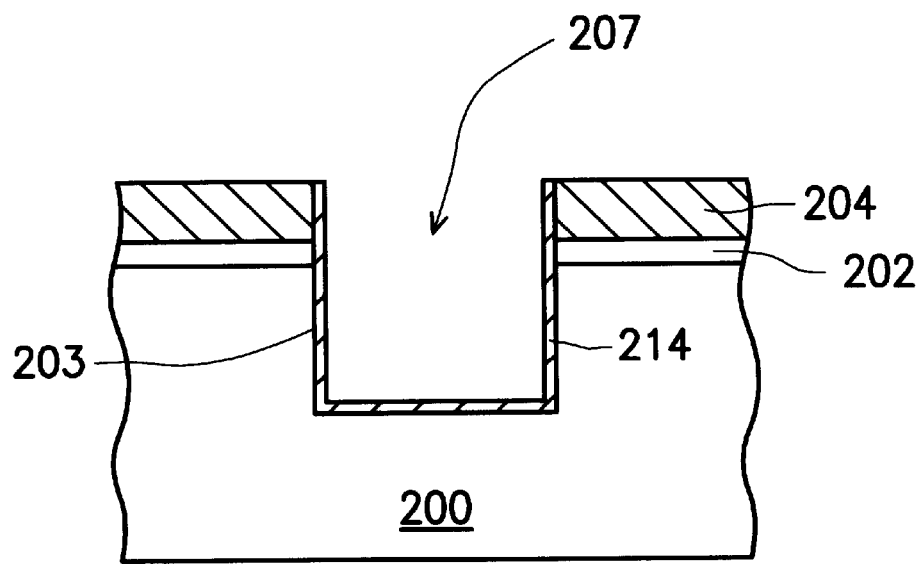

Referring to FIG. 2B, after removing the photoresist layer 206, a silicon nitride layer 214 is formed on the exposed inner surface 203 of the shallow trench 207. The silicon nitride layer 214 can be formed by CVD and the preferred thickness of the silicon nitride layer 214 can be about 50 to 100 Å.

Figure 2C:
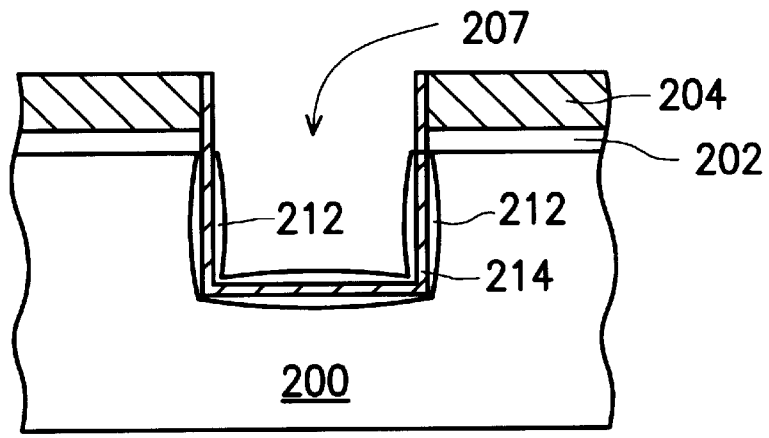

Referring to FIG. 2C, an oxide layer 212 is then formed over the exposed inner surface 203 of the shallow trench 207, preferably by thermal oxidation. Substantially simultaneously, oxygen in the air at the exposed side of the silicon nitride layer 214 penetrate through the silicon nitride layer 214 and react with the silicon substrate 200 to form silicon oxide. Also, the silicon of the silicon substrate 200 penetrates through the silicon nitride layer 214 to react with oxygen in the air and form the liner oxide layer 212 covering substantially the whole silicon nitride layer 214. However, around the top corner 211 and the bottom corner 213, the silicon oxide layer grows along the orientation of (111) and therefore the silicon oxide layer here grows slower and has a thinner thickness. On the contrary, at the middle portion of the periphery of the shallow trench 207, the silicon oxide layer grows along the orientation of (100) or (110) so that the silicon oxide layer here grows faster and has a thicker thickness. Consequently, the liner oxide layer 212 at the middle portion of the periphery of the shallow trench 207 is thicker than at the top corner and the bottom corner.

Figure 2D:
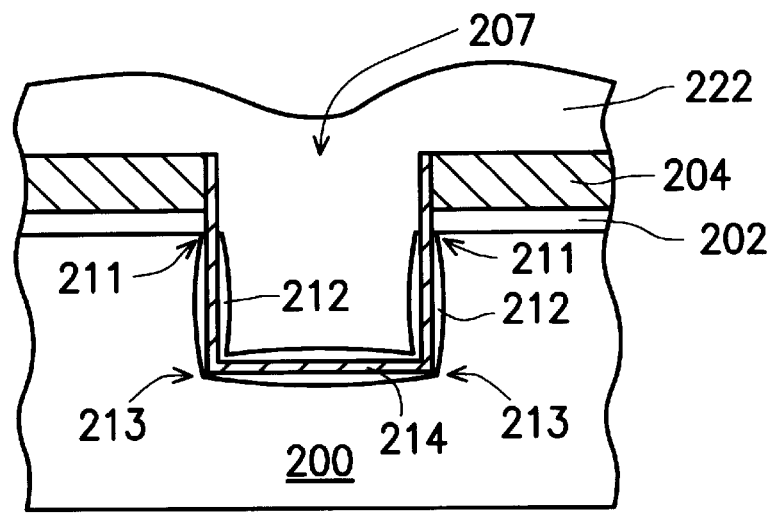

Then, referring to FIG. 2D, an oxide layer 222 is deposited to fill the shallow trench 207 by, for example, APCVD. The level of the oxide layer 222 is preferably higher than the silicon nitride layer 204. The APCVD deposition step can be performed by using tetra-ethyl-ortho-silicate (TEOS) as source gas. The TEOS oxide layer 222 is preferably densified at a temperature of about 1000° C. for about 10 to 30 minutes. During the high temperature of the densification, the inconsistent thickness of the liner oxide layer 212 produces different compress stress to the silicon substrate 200. However, the silicon nitride layer located adjacent the liner oxide layer 212 contributes tensile stress which offsets the compress stress produced by the liner oxide layer 212. As a result, the phenomenon of dislocation can be prevented.

Figure 2E:
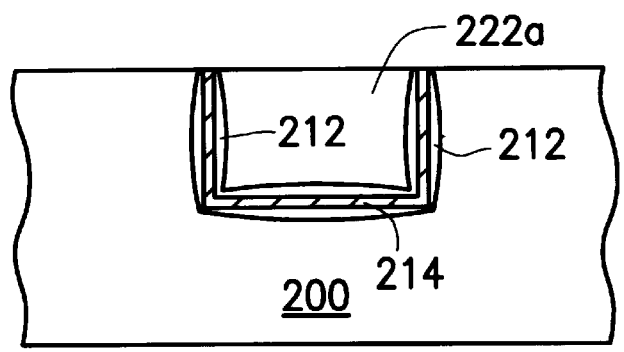

Referring to FIG. 2E, in the existence of slurry and under well-controlled pressure, a CMP process is performed to polish the oxide layer 222. The oxide layer 222 is polished to expose the silicon nitride layer 104. Then, hot phosphoric acid is preferably used to remove the silicon nitride layer 204 and hydrofluoric acid is preferably used to remove the pad oxide layer 202 and the remained oxide layer 222 higher than the surface of the substrate 200. As a result, the silicon oxide layer 222a remains at the shallow trench 207.

In conclusion, according to the invention, a silicon nitride layer is deposited on the periphery of the shallow trench. The extensive stress produced by the silicon nitride layer offsets the compress stress produced by the liner oxide layer. Therefore, the phenomenon of dislocation occurs below the active region and the shallow trench can be prevented.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method of forming a shallow trench isolation structure, comprising:

providing a substrate;

forming a first oxide layer and a mask layer on the substrate successively;

patterning the mask layer and the first oxide layer and the substrate to form a shallow trench at the substrate, wherein the shallow trench has an inner surface, a top corner and a bottom corner;

forming a silicon nitride layer on the inner surface of the shallow trench;

performing a thermal treatment for forming a second oxide layer substantially covering the silicon nitride layer and a third oxide layer between the silicon nitride layer and the inner surface of the shallow trench, wherein the second oxide layer and the third oxide layer are formed simultaneously after the silicon nitride layer is formed;

forming a fourth oxide layer over the silicon nitride layer to fill in the shallow trench and performing a densification process;

performing a planarization step to planarize the fourth oxide layer until the mask layer is substantially exposed;

removing the mask layer; and removing the first oxide layer and a portion of the fourth oxide layer that is higher than the substrate, whereby the shallow trench isolation structure is formed.

2. A method as claimed in claim 1, wherein the first oxide layer includes a pad oxide layer.

3. A method as claimed in claim 1, wherein the method for forming the first oxide layer includes thermal oxidation.

4. A method as claimed in claim 1, wherein the first oxide layer has a thickness of about 50 to 500 Å.

5. A method as claimed in claim 1, wherein the mask layer comprises a silicon nitride layer.

6. A method as claimed in claim 1, wherein the method for forming the mask layer includes chemical vapor deposition.

7. A method as claimed in claim 1, wherein the mask layer has a thickness of about 1000 to 2000 Å.

8. A method as claimed in claim 1, wherein the method for forming the shallow trench includes anisotropic etching.

9. A method as claimed in claim 1, wherein the method for forming the silicon nitride layer includes chemical vapor deposition.

10. A method as claimed in claim 1, wherein the silicon nitride layer has a thickness of about 50 to 100 Å.

11. A method as claimed in claim 1, wherein the thermal treatment comprises thermal oxidation.

12. A method as claimed in claim 1, wherein the second oxide layer includes a liner oxide layer.

13. A method as claimed in claim 1, wherein the second oxide layer is thinner at the top corner and the bottom corner of the shallow trench than at a middle portion of a periphery of the shallow trench.

14. A method as claimed in claim 1, wherein the third oxide layer is thinner at the top corner and the bottom corner of the shallow trench than at a middle portion of a periphery of the shallow trench.

15. A method as claimed in claim 1, wherein method for forming the fourth oxide layer includes chemical vapor deposition.

16. A method as claimed in claim 1, wherein the densification process is performed at about 1000° C. for about 10 to 30 minutes.

17. A method as claimed in claim 1, wherein the planarization step includes chemical mechanical polishing.

18. A method as claimed in claim 1, wherein the method for removing the mask layer includes using hot phosphoric acid.

19. A method as claimed in claim 1, wherein the method for removing the first oxide layer and a portion of the fourth oxide layer that is higher than the substrate includes using hydrofluoric acid.

20. A method of fabricating a shallow trench isolation structure, comprising:

providing a substrate;

patterning the substrate to form a shallow trench in the substrate, wherein the shallow trench comprises an inner surface;

forming a silicon nitride layer covering the inner surface of the shallow trench, wherein the silicon nitride layer contacts with the substrate exposed by the shallow trench; and forming a planarized oxide layer in the shallow trench so as to form the shallow trench isolation structure.

21. A method as claimed in claim 20, wherein the shallow trench is formed by using anisotropic etching.

22. A method as claimed in claim 20, wherein the silicon nitride layer has a thickness of about 50 to 100 Å.

23. A method as claimed in claim 20, wherein after the formation of the silicon nitride layer, a thermal treatment is further performed to form simultaneously a first oxide layer covering the silicon nitride layer and a second oxide layer between the silicon nitride layer and the inner surface of the shallow trench.

24. A method as claimed in claim 23, wherein the thermal treatment comprises a thermal oxidation.

* * * * *